United States Patent [19]

Flannagan et al.

[11] Patent Number: 4,636,991

[45] Date of Patent: Jan. 13, 1987

[54] SUMMATION OF ADDRESS TRANSITION SIGNALS

[75] Inventors: Stephen T. Flannagan; Paul A. Reed, both of Austin, Tex.

[73] Assignee: Motorola, Inc., Schaumburg, Ill.

[21] Appl. No.: 766,616

[22] Filed: Aug. 16, 1985

[51] Int. Cl.[4] .............................................. G11C 8/00
[52] U.S. Cl. ..................................... 365/230; 365/203
[58] Field of Search ............... 365/189, 190, 203, 230, 365/233

[56] References Cited

U.S. PATENT DOCUMENTS

| | | | |
|---|---|---|---|
| 4,272,832 | 6/1981 | Ito ........................................ | 365/189 |
| 4,355,377 | 10/1982 | Sud et al. ............................ | 365/203 |
| 4,581,718 | 4/1986 | Oishi .................................... | 365/189 |

Primary Examiner—Joseph A. Popek
Attorney, Agent, or Firm—John A. Fisher; Jeffrey Van Myers; James L. Clingan, Jr.

[57] ABSTRACT

A memory circuit, in using address transition detection to equilibrate bit lines, generates a summation address transition signal for the row address as well as a summation address transition signal for the column address. There is a transition detector for each address signal. The outputs of the transition detectors for the row address signals are summed in at least two logic stages using CMOS logic gates to generate the summation address signal for the row address. Similarly, the outputs of the transition detectors for the column address signals are summed in at least two logic stages using CMOS logic gates to generate the summation address signal for the column address.

12 Claims, 8 Drawing Figures

SUMMATION OF ADDRESS TRANSITION SIGNALS

CROSS-REFERENCE TO RELATED APPLICATIONS

Related subject matter is disclosed in the following related applications assigned to the assignee hereof:
1. U.S. patent application Ser. No. 762,341 entitled "Asynchronous Row and Column Control," filed Aug. 5, 1985; and
2. U.S. patent application Ser. No. 762,362 entitled "Bit Line Precharge on a Column Address Change," filed Aug. 5, 1985; and
3. U.S. patent application Ser. No. 750,637 entitled "Memory Architecture," filed July 1, 1985.

FIELD OF THE INVENTION

The present invention relates to memories which utilize address transition detection, and more particularly, to memories which provide a summation for a plurality of address transition detectors.

BACKGROUND OF THE INVENTION

In memories which use address transition detection it is typical to have a separate address transition detector for each address signal for which transitions are to be detected. If any transition of the row address is to be detected, then a transition detector is commonly used for each row address signal. Each transition detector generates a pulse in response to a transition of the particular row address signal to which it corresponds. The outputs of these detectors are then summed to provide a single pulse which can be referred to as the summation of address transitions (SAT) pulse. This SAT pulse is then used to directly generate an equalization pulse which is used to equalize the bit lines upon its generation and to begin the sensing of data upon its termination. Although other signals, such as chip enable and write enable, may also be used in controlling the equalization pulse, the SAT pulse is the key pulse in the successful generation of the equalization pulse.

In the prior art, the summation function to generate the SAT pulse was achieved with a single, multiple-input NOR gate. The actual pulse generated by the large NOR gate is normally high and is pulsed to a logic low in response to an address transition so that the so generated is complementary to SAT and referred to as *SAT. The outputs of each of the transition detectors was connected to the inputs of this NOR gate. In the case of 7 row addresses typical for a 16K static random access memory (SRAM), this meant there were 7 transistors connected to a common output node for the *SAT pulse. This made this output node for the *SAT pulse highly capacitive. This is shown in FIG. 5 of U.S. Pat. No. 4,355,377, Sud et al. As SRAMs have reached higher densities such as 64K, the number of row addresses increased as well, raising the relative capacitance of the output node for the SAT pulse. The desire is for these transistors connected between the transition detectors and the output node to quickly pull down the output node to ground with the first edge of the signal provided by a transition detector. This has been difficult to achieve because the desire is also to quickly drive the output node to the power supply voltage to terminate the SAT pulse on the second edge of the signal provide by a transition detector. In order to drive the output node back up to or near the power supply voltage, a relatively large load device connected between the power supply and the output node was required. This limited the output swing on the output node and became related to the ratio of the gains of the load device and the pull-down transistors. The NOR gate was not ratioless. The gain for a single input was much less than unity gain. This is particularly undesirable because the desired fan-out for a SAT signal is quite large. If more than one load device was activated simultaneously, the output node was pulled closer to ground but this, of course, could not be relied upon. Because the pull-up is passive while the pull-up is passive, the relative timing of the pull-up and pull-down do not track with process variations. In those designs in which both row and column address transitions were detected the problems were even more severe because the wide NOR gate was extended across the whole chip, adding much capacitance and thus exacerbating the process tracking and gain problems.

To improve this situation, the load was clocked. In CMOS embodiments, the load device was a P channel transistor so that the output node could be brought to full power supply voltage with a clock signal that did not have to be bootstrapped. One clocking technique that was used was to use feedback from the equalization circuitry to turn the load device on and off. After the equalization circuitry received the *SAT pulse, the equalization circuit would output a feedback signal to enable the load device for termination of the *SAT signal. This was effective for the case in which there was only one address transition or all of the address transitions were simultaneous. The feedback was timed such that the feedback signal would not activate the load until at least the pulse from the activated transition detector was terminated. The load device was then turned on after the activated pull-down transistor or transistors was turned off. For the address skew case, however, the case in which the address transitions are not simultaneous but are separated in time, there arose a problem. The feedback signal would be generated in response to the first address transition so that the load transistor would be activated, but a second address transition would activate one of the pull-down transistors while the load was being activated by the feedback signal. This is the very situation to be avoided. The address transition detection performance was thus not asynchronous. Furthermore, the tracking issue remained a problem with this type of feedback reset of the *SAT node. For example, if transistors of shorter channel length were introduced into the process (which is often done to increase circuit speed), the feedback path could speed up more than the input to the NOR gate. This would cause the pulse width to get shorter and perhaps disappear altogether for some input conditions. This has been a typical problem in the design of self-resetting pulses and logic differentiators.

Another approach has been to clock the load using the transition detectors. This type of technique made the performance more nearly asynchronous, but did not not remove the basic problem of less than unity gain, non-tracking with process, and the problems associated with pulling down a large capacitance. It also made it necessary to run the reset signals across the chip.

SUMMARY OF THE INVENTION

An object is to provide a memory with an improved summation address transition pulse.

Another object of the invention is to provide an improved circuit for providing a summation address transition pulse.

Yet another object is to provide a summation address transition pulse with improved wave-shape consistency.

These and other objects are achieved in a memory having a plurality of memory cells, a row decoder, a column decoder, a plurality of row address transition detectors, a first logic circuit, and a second logic circuit. The plurality of memory cells are located at intersections of bit line pairs and word lines. Each memory cell is selected by an enabled word line and a selected bit line. The row decoder is coupled to the word lines for enabling a word line in response to a plurality of row address signals. The column decoder is coupled to the bit line pairs for selecting a bit line pair in response to a plurality of column address signals. The plurality of row address transition detectors are coupled to respective row address signals. Each row address transition detector is for providing a detection pulse in response to detecting a transition of the respective row address signal coupled thereto. The first logic circuit is coupled to the plurality of row address transition detectors and provides a plurality of intermediate signals. Each intermediate signal corresponds to a subset of the detection signals and occurs in response to an occurrence of at least one of the detection pulses in the subset to which the intermediate signal corresponds. The second logic circuit is coupled to the first logic circuit and provides a summation address transition signal in response to the occurrence of at least one of the intermediate signals.

DESCRIPTION OF THE INVENTION

Figure 1:
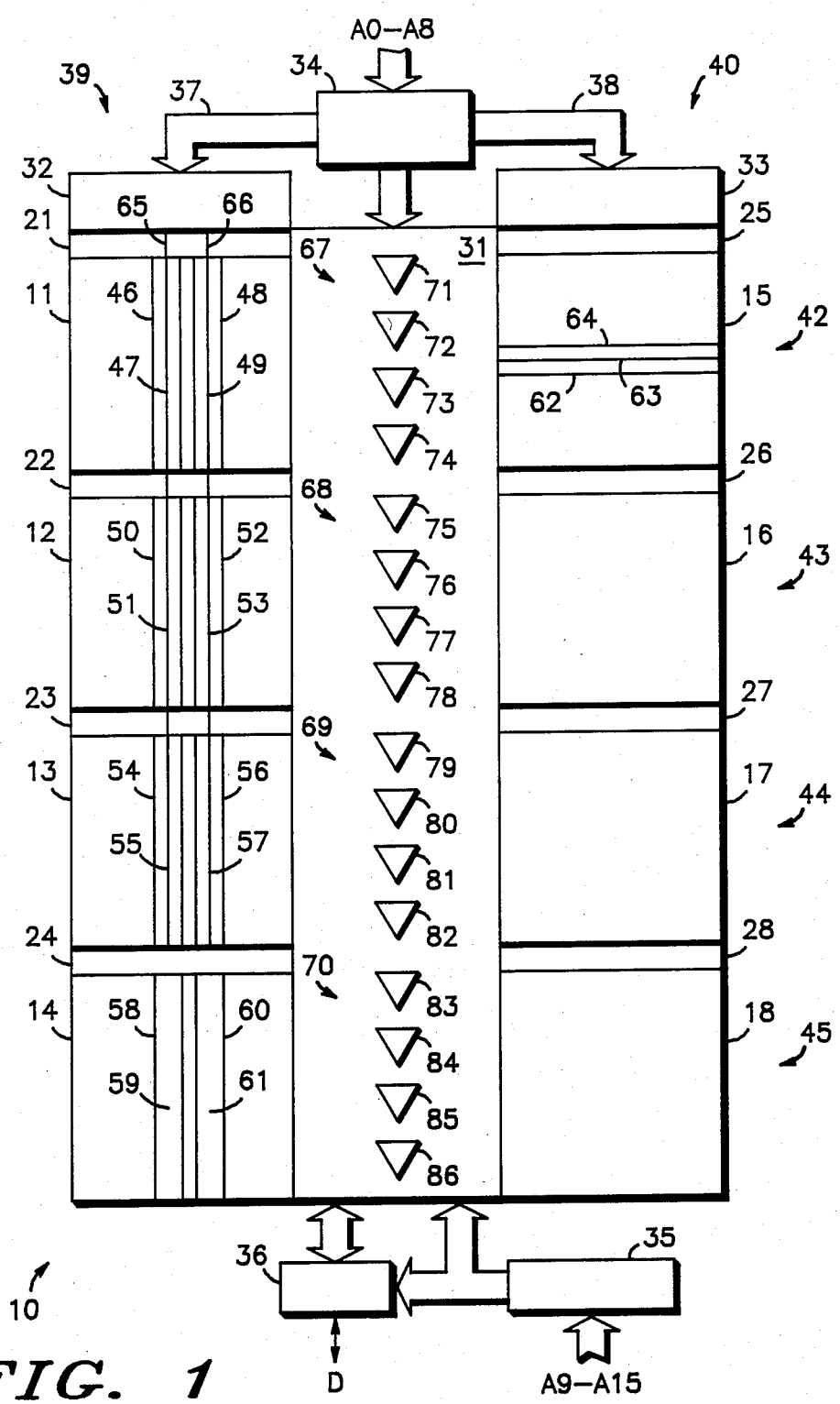
FIG. 1 is a layout of a memory useful in understanding the present invention.

Shown in FIG. 1 is a memory 10 in layout form showing the physical relationship of the certain important functional blocks which comprise a memory architecture. Memory 10 comprises 8 sub-arrays 11, 12, 13, 14, 15, 16, 17, and 18; 8 word line driver blocks 21, 22, 23, 24, 25, 26, 27, and 28; a column block 31; a left global row decoder 32; a right global row decoder 33; a row address buffer/control block 34; a column address buffer/control block 35; and a control data I/O block 36. The various functional blocks are located primarily in relation to each other in layout form as is typical of architecture definition in a memory. FIG. 1 shows the architecture in two dimensional form with a top and a bottom, and a left and a right. The row address buffer/control block 34 is at the top with a bus 37 running down and to the left to the left global row decoder block, and with a bus 38 running down and to the right to the right global row decoder 32. Word line driver block 21 is immediately below row decoder 32. Sub-array 11 is immediately below word line driver 21. Word line driver 22 is immediately below sub-array 11. Sub-array 12 is immediately below driver 22. Word line driver 23 is immediately below sub-array 12. Sub-array 13 is immediately below driver 23. Word line driver 24 is immediately below sub-array 13. Sub-array 14 is immediately below driver 24. Word line driver block 25 is immediately below row decoder 33. Sub-array 15 is immediately below word line driver 25. Word line driver 26 is immediately below sub-array 15. Sub-array 16 is immediately below driver 26. Word line driver 27 is immediately below sub-array 16. Sub-array 17 is immediately below driver 27. Word line driver 28 is immediately below sub-array 17. Sub-array 18 is immediately below driver 28. Sub-arrays 11–14, which run in a top to bottom direction, form a column 39 of sub-arrays. Sub-arrays 15–18, which run in a top to bottom direction, form a column 40 of sub-arrays. Sub-arrays 11 and 15, which run in a left to right direction, form a row 42 of sub-arrays. Sub-arrays 12 and 16, which run in a left to right direction, form a row 43 of sub-arrays. Sub-arrays 13 and 17, which run in a left to right direction, form a row 44 of sub-arrays. Sub-arrays 14 and 18, which run in a left to right direction, form a row 45 of sub-arrays. Column block 31 runs between, and in parallel with, columns 39 and 40. Column block 31 is thus interposed and breaks into each of rows 42–45. Word line drivers 21–24 are on top of sub-arrays 11–14, respectively, of column 39. Word line drivers 25–28 are on top of sub-arrays 15–18, respectively. As used herein, "on top of" is used in the two dimensional planar sense as is appropriate for describing an architecture.

Sub-arrays 11–18 each have 128 overlying bit line pairs and 64 overlying word lines. As used herein, "overlying" is used in the three dimensional sense. The use of word lines and bit lines is well known in the art. By way of example, 4 word lines are shown for each of sub-arrays 11–14, and 3 bit lines are shown for sub-array 15. The word lines run in a top to bottom direction, and the bit lines run in a left to right direction. For sub-array 11, word lines 46–49 are shown. For sub-array 12, word lines 50–53 are shown. For sub-array 13, word lines 54–57 are shown. For sub-array 14, word lines 58–61 are shown. For sub-array 15, bit line pairs 62–64 are shown. Columns 39 and 40 each have 32 row select lines which run in the top to bottom direction. By way of example, row select lines 65 and 66 are shown for column 39. For each row select line there are two corresponding word lines adjacent to that row select line for each sub-array in the particular column. Each word line is adjacent to only one row select line, that being the corresponding row select line. Row select line 65 has corresponding word lines 46–47, 50–51, 54–55, and 58–59. Row select line 66 has corresponding word lines 48–49, 52–53, 56–57, and 60–61. Row select lines 65 and 66 extend from row decoder 32 to word line driver 24, overlying sub-arrays 11–13 therebetween.

The word lines are formed in two layers. One layer is polysilicon which forms the gates of transfer transistors which enable individual memory cells. The other layer is metal which overlies the polysilicon word lines. Each overlying metal word line is strapped to a corresponding polysilicon word line to increase the speed with which the memory cells are accessed. This strapping of overlying metal to polysilicon for high speed word lines is known in the art. The row select lines are metal lines formed in the same layer as the metal word lines. The row select lines carry information used by the word line drivers so terminate with the last word line driver. The row select lines, thus need not extend to overlie the last sub-array in the column of sub-arrays. As shown, row select lines 65 and 66 do not extend to overlie sub-array 14, the last sub-array in column 39. Each row select line runs between the word lines which correspond to that row select line over all but the last sub-array. As shown in FIG. 1, row select line 65 runs between word lines 46 and 47 over sub-array 11, and between word lines 50 and 51 over sub-array 12, and between word lines 54 and 55 over sub-array 13.

Column block 31 is coupled to sub-arrays 11-18, word line drivers 21-28, block 34, block 35, and block 36. Column block 31 provides column decoding, local sensing of data, routing of sub-array selection signals, and data routing. There are 65,536 memory locations defined by the 16 address signals A0-A15. Address signals A0-A8 define which word line is activated (or enabled). With 64 word lines and 8 sub-arrays this is a one of 512 selection. Column block 31 routes the sub-array selection signals to the word line drivers to aid in the word line enabling process. Each column 39, 40 has 32 row select lines so there are a total of 64 row select lines. Address signals A0-A5 provide a one of 64 selection to define which of the row select lines is activated. One of the two word lines which correspond to the activated row select line will be activated. This one of two selection is determined by address A6. Address A5 defines between left and right, i.e., between column 39 and 40. Block 34 provides 16 sub-array selection signals to column block 31. Each word line driver block receives two of these sub-array selection signals. For a given word line selection, only one of the 16 sub-array selection signals is activated. The reason each word line driver block receives two sub-array selection signals is to select between the two word lines which correspond to and are adjacent to the activated row select line. Address signals A7 and A8 define which sub-array within a column of sub-arrays is selected. Address signals A5, A7, and A8 define which sub-array is activated for purposes of precharging as well as word line selection.

In a read mode, when one of signals A0-A8 switches state, a row address transition signal is activated which causes the selected sub-array to be precharged. This has become a typical technique in high speed SRAMS. The precharging of a sub-array is to precharge and equalize the bit lines thereof. This precharging is a significant portion of the power consumed by the memory. As such a significant power saving is achieved by precharging only the sub-array which is to provide data. Address signals A5, A7, and A8 determine which single sub-array is precharged in response to an address transition of one or more of address signals A0-A8. All other sub-arrays remain precharged and deselected.

In conjunction with a word line being activated, column block 31 provides decoding and sensing in order to obtain the selected data from the activated sub-array in the read mode. Address signals A9-A15 provide a one of 128 selection to define which bit line within the sub-array will provide the data. In the sensing procedure as well as the word line selection procedure, the activated sub-array must be determined. The sub-array selection signals are also useful for this purpose because they define which sub-array is selected. There are four sets of sense amplifiers 67, 68, 69, and 70 present in column block 31, corresponding to rows 42, 43, 44, and 45, respectively. Each set of sense amplifiers is comprised of four sense amplifiers. Set 67 is comprised of sense amplifiers 71-74 in close proximity to corresponding sub-arrays 11 and 15. Set 68 is comprised of sense amplifiers 75-78 in close proximity to corresponding sub-arrays 12 and 16. Set 69 is comprised of sense amplifiers 79-82 in close proximity to corresponding sub-arrays 13 and 17. Set 70 is comprised of sense amplifiers 83-86 in close proximity to corresponding sub-arrays 14 and 18. Predecoding defined by address signals A9-A13 couples 4 bit line pairs from an activated sub-array to respective sense amplifiers which correspond to the activated sub-array.

Figure 2:
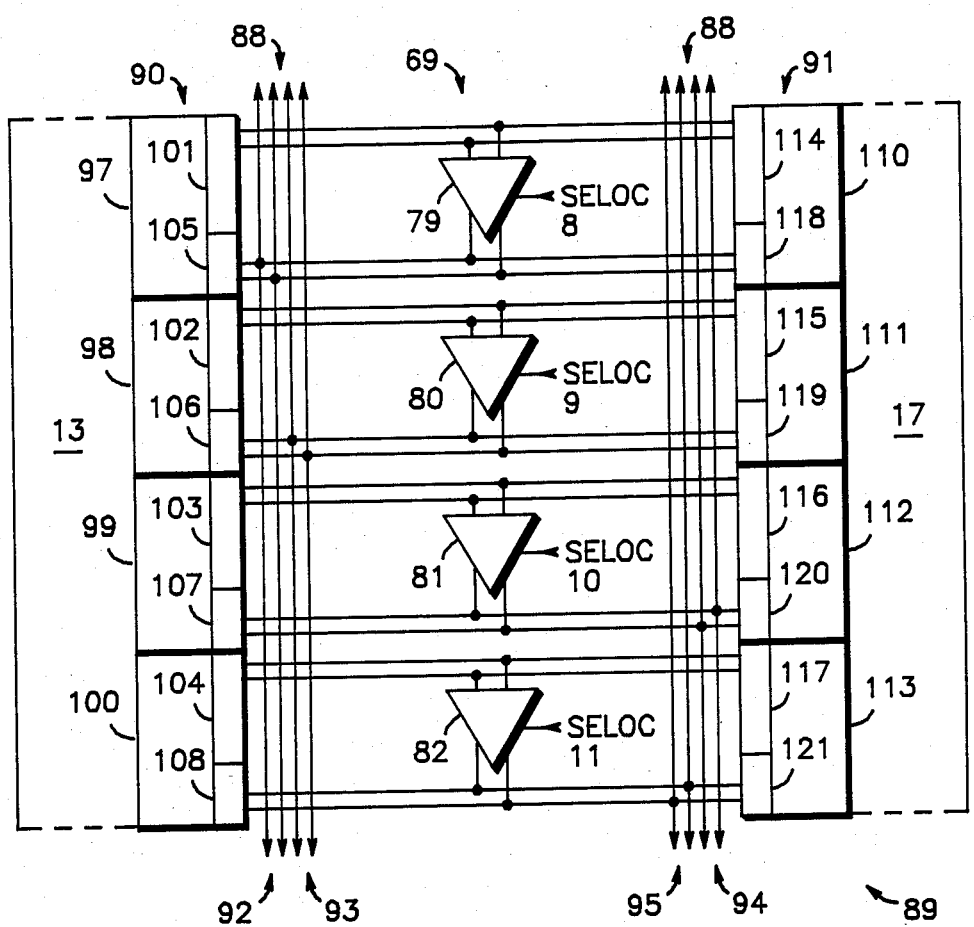
FIG. 2 is a block diagram of a portion of the memory circuit of FIG. 1.

Global data lines 88 not shown in FIG. 1 but shown in FIG. 2 are routed from sense amplifiers 71-86 through column block 31 to block 36. Shown in FIG. 2 is a portion 89 of column block 31 and sub-arrays 13 and 17. Portion 89 comprises a column decoder portion 90 coupled to sub-array 13, a column decoder portion 91 coupled to sub-array 17, set of sense amplifiers 69, as well as global data lines 88. Four pairs of data lines 92, 93, 94, and 95 comprise global data lines 88. Each of the sets of sense amplifiers 67-70 has outputs controllably coupled to these four data line pairs 92-95. Which set of amplifiers that is coupled to the data line pairs is defined by address signals A7 and A8. Each set of amplifiers 67-70 has inputs which are controllably coupled to one of the two sub-arrays that are in the same row. Which one of the four pairs of data lines 92-95 is selected for data is determined by address signals A14 and A15. Signals A14 and A15 also define which of the four sense amplifiers within the set of amplifiers is not disabled. The control signals necessary to provide the one of four data pair selection are coupled from block 35 to block 36.

In a write mode the word line selection is the same as for the read mode. In the write mode the bit line pairs need not be precharged. The column decoding is also very similar. A write driver is employed instead of sense amplifiers. The write driver is located in block 36. Address signals A14 and A15 determine which pair of global data lines 88 carry the data to be written. The sense amplifiers are all made to be high impedance, commonly known as tri-stated. The sense amplifiers are bypassed in the write mode so that the selected data line pair is coupled to the column decoder. For a given address, there are 4 data paths made available between the selected sub-array and the set of sense amplifiers for that sub-array. A bypass for each between the global data lines and the decoders establishes 4 paths to the sub-array when only one is desired. Three of these potential data paths are blocked as determined by address signals A14 and A15.

Figure 4:
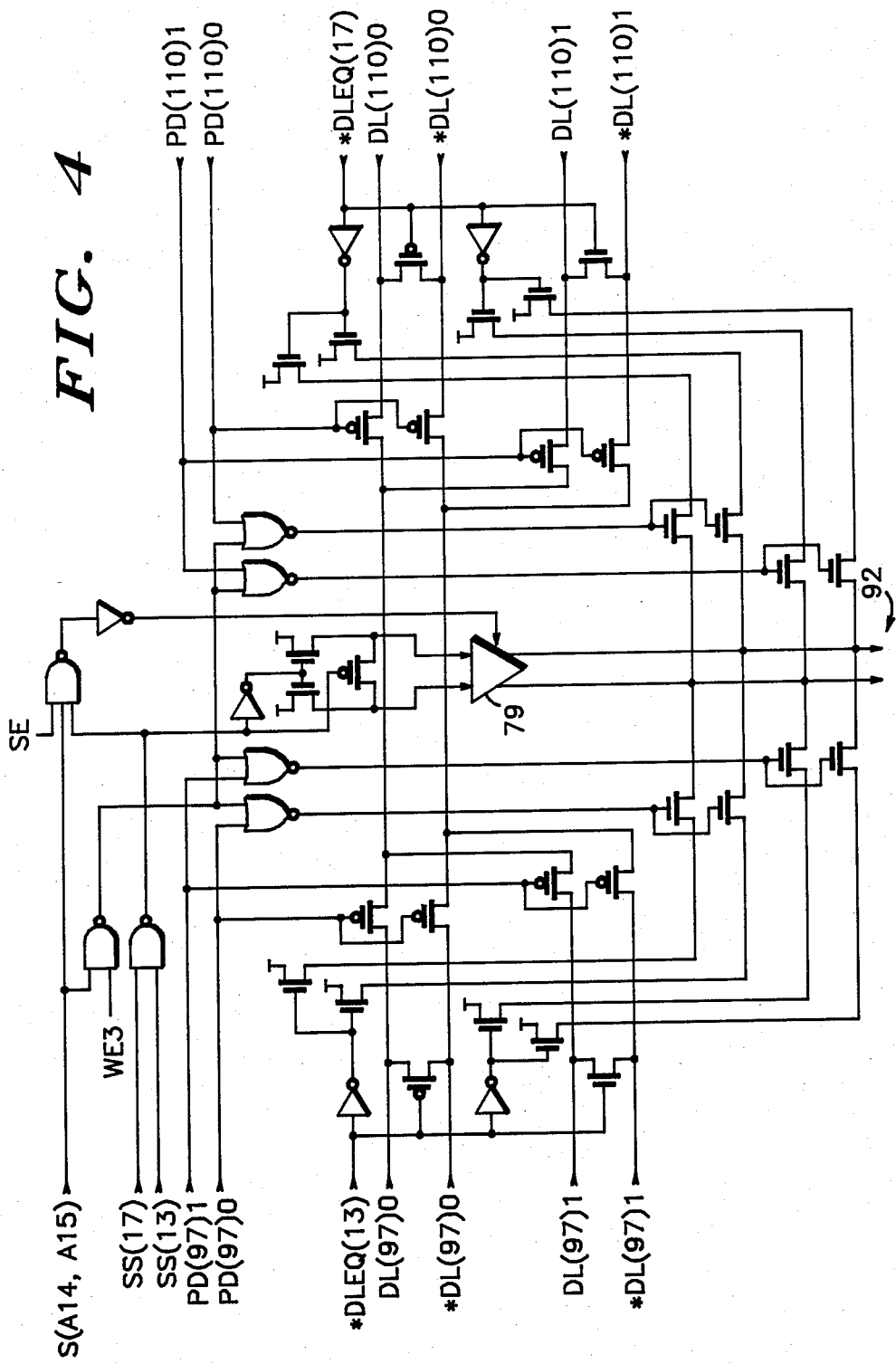
FIG. 4 is a combination block and circuit diagram of a second portion of the block diagram of FIG. 2.

Shown in FIG. 4 are more details helpful in describing the data selection and sensing process provided by column block 31. Column decoder 90 is comprised of four column pre-decoders 97, 98, 99, and 100; four secondary column decoders 101, 102, 103, and 104; and four write coupling circuits; 105, 106, 107, and 108. Similarly, column decoder 91 is comprised of four column pre-decoders 110, 111, 112, and 113; four secondary column decoders 114, 115, 116, and 117; and four write coupling circuits; 118, 119, 120, and 121. Each of the other sub-array pairs 11-15, 12-16, and 14-18 also have an associated four column pre-decoders, four secondary column decoders, and four write coupling circuits. Sense amplifiers 71-86 each receive a select operating clock unique to that amplifier designated SELOC 0-15. As shown in FIG. 2, amplifiers 79, 80, 81, and 82 receive clocks SELOC 8, SELOC 9, SELOC 10, and SELOC 11. Only one of the SELOC clocks is active for a given data access in the read mode. In the write mode, all of the SELOC clocks are inactive.

Assume as an example that data from sub-array 13 is to be output on data line pair 92. A word line in sub-array 13 is activated as determined by address signals A0-A8. Decoders 97-100 all respond to the address by providing an output to secondary decoders 101-104, respectively. Decoders 97-100 are each coupled to one fourth of the 128 bit line pairs of sub-array 13 which is 32 bit line pairs. Decoders 97-100 provide a 2 of 32 selection so that two bit line pairs are coupled to each of secondary decoders 101-104 via decoders 97-100. Secondary decoders 101-104 each have a pair of outputs coupled to inputs of amplifiers 79-82, respectively. Secondary decoders 101-104 perform a one of two selection to couple a bit line pair of each of amplifiers 79-82. The one of two selection is determined by the state of address signal A9. Secondary decoders 114-117 all are tri-stated to provide a high impedance output. Amplifiers 79-82 each have a pair of outputs coupled to data line pairs 92-95, respectively. In the present example, SELOC 8 is activated while clocks SELOC 9-11 remain inactive so that only amplifier 79 is activated. Consequently, the data carried by the pair of bit lines coupled to amplifier 79 is provided onto data line pair 92 where it is received by block 36. In the inactive state, amplifiers 80-82 are tri-stated.

If a write is to occur into sub-array 13 via data line pair 92, a word line in sub-array 13 is activated as determined by address signals A0-A8. All of clocks SELOC 8-11 will be inactive so that amplifiers 79-83 will be tri-stated. Block 36 provides the data onto data line 92 as determined by address signals A14 and A15. In response to the address, decoder 97 has two bit line pairs coupled to write coupling circuit 105. Write coupling circuit 105 couples data line 92 to one of these pairs as determined by address signal A9. Thus the data is coupled to the selected memory cell at the intersection of the activated word line and the selected bit line pair.

Figure 3:
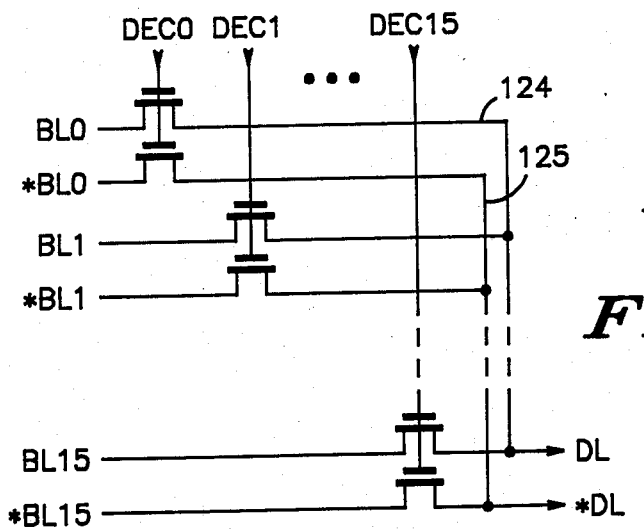
FIG. 3 is circuit diagram of a first portion of the block diagram of FIG. 2.

Decoders 97-100 and 100-113 each have two pass gate portions like pass gate circuit 123 shown in FIG. 3 for coupling bit lines to secondary decoders 101-104 and 114-117. There are 16 decoded address signals DEC0-DEC15 which are generated in response to address signals A10-A13 for coupling one of 16 bit lines to a local data line. In a selected sub-array as determined by address signals A5, A7, and A8, one of signals DEC-0-DEC15 is activated for each pass gate circuit. There are 8 pass gate circuits for each sub-array. In the deselected sub-arrays, all signals DEC0-DEC15 are held inactive. As shown in FIG. 3, bit lines BL0-BL15 are selectively coupled to a local data line 124 and the complementary bit lines *BL0-*BL15 are selectively coupled to local data line 125. The coupling from bit line to local data line is achieved with a single pass gate for each bit line so that there are 16 pass gates per local data line. Each secondary decoder 101-104 and 114-117 is coupled to 2 corresponding data line pairs. The single pass gate is shown to be an N channel transistor. It is preferred, however, to have an additional P channel in parallel with the N channel transistors which are enabled by signals complementary to the DEC0-DEC15 signals. This can be viewed as using conventional transmission gates for the pass gates. Each secondary decoder is coupled to 2 local data line pairs. Each corresponding write coupling circuit is also coupled to the same pair of local data lines.

Shown in FIG. 4 is a circuit/logic diagram of secondary decoders 101 and 114, and write coupling circuits 105 and 118. Sense amplifier 79 is also shown in FIG. 4. Signals DL(97)0, *DL(97)0, DL(97)1, and *DL(97)1 are the decoded outputs of decoder 97 present on the local data lines thereof. Similarly, signals DL(110)0, *DL(110)0, DL(110)1, and DL(110)1 are the decoded outputs of decoder 110 present on the local data lines thereof. Signals *DLEQ(13) and *DLEQ(17) are equalization pulses generated in response to a row or column address transition and controlled by address signals A5, A7, and A8 to activate only the equalization pulse corresponding to the selected sub-array. Signals PD(97)1, PD(97)0, PD(110)1, and PD(110)0 are selected to be active by address signals A5, A7, A8, and A9 to enable a selected pass device. Signals SS(13) and SS(17) are defined by address signals A5, A7, A8 as sub-array select signals. Signal WE3 is a write enable signal which is active as a logic high during a write. Signal S(A14, A15) is a sense amplifier selection signal defined by address signals A14 and A15. Signal SE is a sense amplifier enable signal which will disable all of the sense amplifiers when it is a logic low. The transistors which have a circle on the gate are P channel transistors and the others are N channel.

Figure 5:
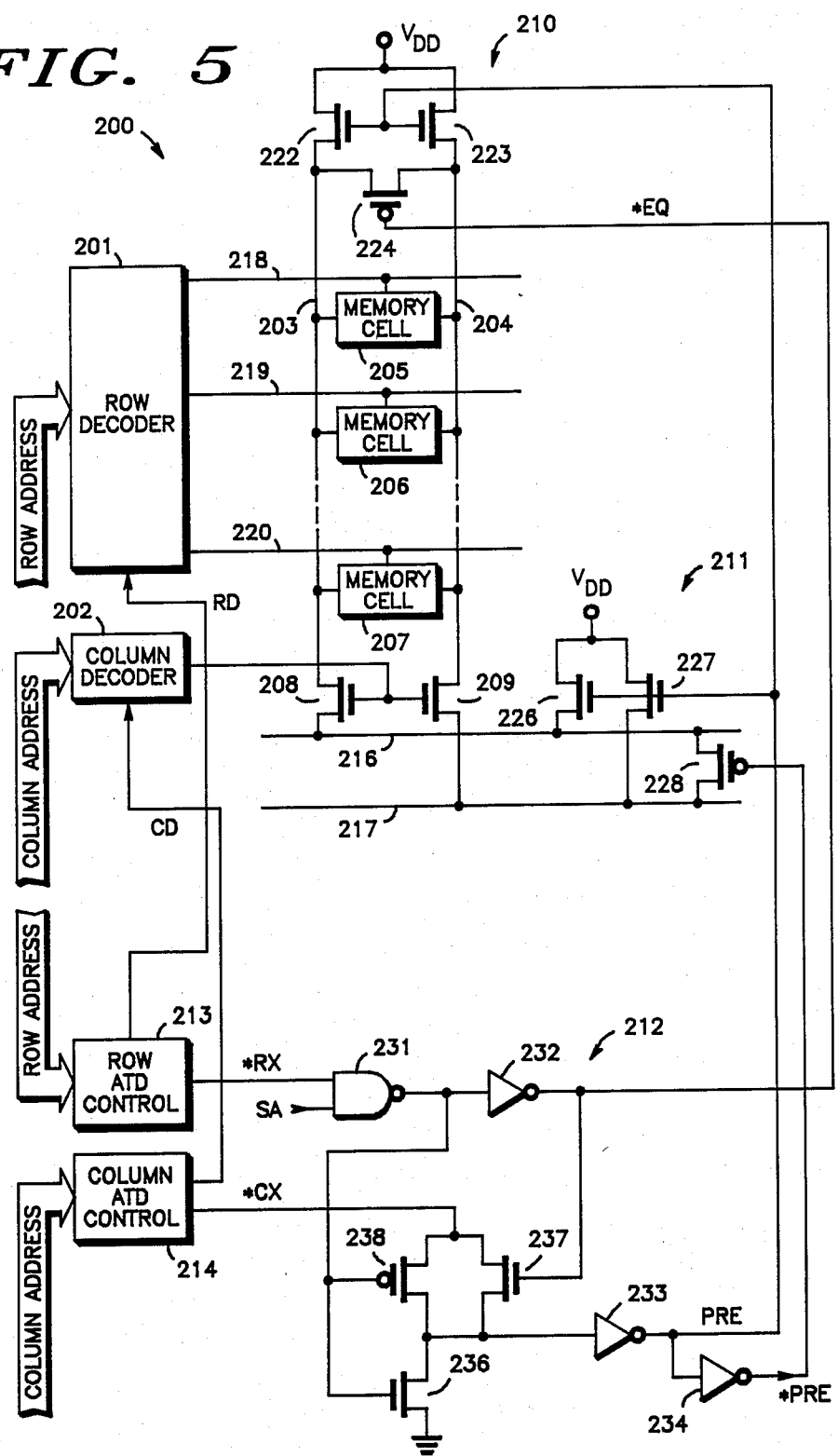
FIG. 5 is a combination block diagram and circuit diagram of a precharge and decoder control circuit according to a preferred embodiment of the invention.

Shown in FIG. 5 is a portion 200 of memory 10, comprised generally of a generalized row decoder 201, a generalized column decoder 202, bit lines 203 and 204, memory cells 205, 206, and 207, decoder coupling transistors 208 and 209, a bit line equilibration circuit 210, a data line equilibration circuit 211, an equilibration logic circuit 212, a row address transition detection (ATD) and control circuit 213, a column ATD and control circuit 214, data lines 216 and 217, and word lines 218, 219, 220. Bit line equilibration circuit 210 comprises N channel transistors 222 and 223 and P channel transistor 224. Data line equilibration circuit 211 comprises N channel transistors 226 and 227 and P channel transistor 228. Equilibration logic circuit 212 comprises a NAND gate 231, inverters 232, 233, and 234, N channel transistors 236 and 237, and P channel transistor 238.

Memory cells 205-207 are conventional static RAM memory cells having inputs coupled to word lines 218-220, respectively, and complementary outputs coupled to bit lines 203 and 204, respectively. Transistor 208 has a gate connected to an output of column decoder 20, a first current electrode connected to bit line 203, and a second current electrode connected to data line 216. Transistor 209 has a gate connected to the output of decoder 202, a first current electrode connected to bit line 204, and a second current electrode connected to data line 217. Transistor 222 has a drain connected to a positive power supply terminal VDD which can be, for example, 5 volts, a gate for receiving a precharge signal PRE generated by logic circuit 212, and a source connected to bit line 203. Transistor 223 has a drain connected to VDD, a gate for receiving signal PRE, and a source connected to bit line 204. Transistor 224 has a first current electrode connected to bit line 203, a second current electrode coupled to bit line 204, and a gate for receiving an equalization signal *EQ generated by logic circuit 212. Transistor 226 has a drain connected to VDD, a source connected to data line 216, and a gate for receiving signal PRE. Transistor 227 has a drain connected to VDD, a source connected to data line 217, and a gate for receiving signal PRE. Transistor 228 has first current electrode connected to data line 216, a second current electrode connected to data line 217, and a gate for receiving a signal complementary to precharge signal *PRE generated by logic circuit 212. NAND gate 231 has a first input for receiving a row transition signal *RX generated by row ATD and control circuit 213, a second input for receiving a sub-array select signal SA, and an output. Inverter 232 has an input connected to the output of NAND gate 231, and an output for providing signal *EQ. Transistor 236 has a source connected to ground, a gate connected to the output of NAND gate 231, and a drain. Transistor 237 has a first current electrode connected to the drain of transistor 236, a gate for receiving signal *EQ, and a second electrode for receiving a column transition signal *CX generated by column ATD and control circuit 214. Transistor 238 has a gate connected to the gate of transistor 236, a first current electrode for receiving signal *CX, and a second electrode connected to the drain of transistor 236. Inverter 233 has an input connected to the drain of transistor 236, and an output for providing signal PRE. Inverter 234 has an input connected to the output of inverter 233, and an output for providing signal *PRE.

Circuit 213 receives the row address and detects a change thereof. When there is a row change, circuit 213 causes signal *RX to switch to a logic low from its normal logic high. Signal *RX pulses to a logic low and switches back to a logic high in about 5 nanoseconds (ns) if there is no address skew. With address skew, signal *RX will remain at a logic low longer. As long as the row address transitions remain relatively close together, signal *RX will remain at a logic low, then switch back to a logic high after the address transitions have been completed. Circuit 214 provides signal *CX in the same way except it does it for column address transitions. Row decoder 201, when enabled, selects a word line such as one of word lines 218–220 as determined by the row address received by row decoder 201. Similarly, decoder 202, when enabled, enables transistors 208 and 209 when selected to do so by the column address. Column decoder 202, of course, has many other outputs (not shown in FIG. 5) which are selectively enabled in order to enable other bit line coupling transistors (also not shown in FIG. 5) as selected by the column address. Circuit 213 provides a row disable signal RD to disable row decoder 201 and a column disable signal to disable column decoder 202. Signals RD and CD each perform their disabling function at a logic low.

When operating at or near the shortest time between cycles, signal RD is a logic high except for the time duration that signal *RX is a logic low during which time RD is also a logic low, disabling row decoder 201 for the time duration that signal *RX is a logic low. For longer times between cycles, signal RD will switch to a logic low to disable row decoder 201 between the end of one cycle and the beginning of the next. The effect of disabling row decoder 201 is to disable all of the word lines in memory 10, such as word lines 218–220 in FIG. 5. The purpose of doing this between cycles is to reduce power consumption. The purpose of disabling the word lines when signal *RX is a logic low is to prevent any word lines from being enabled during equalization. Bit lines 203 and 204 are equalized in response to signal *RX switching to a logic low. For the most common case signal *RX pulses low for about 5 ns, but can extend to longer periods with address skew. NAND gate 231 is forced to provide a logic high output in response to signal *RX switching to a logic low. Signal SA is indicative of which sub-array among sub-arrays 11–18 of FIG. 1 is selected. Each of sub-arrays 11–18 has a circuit such as circuit 212 for receiving signals *RX and *CX. The particular sub-array signal for the selected sub-array is active when it is a logic high. When signal SA is a logic high, NAND gate 231 can respond to signal *RX. In the deselected sub-arrays, the corresponding signal SA is a logic low which forces NAND gate 231 to provide a logic high output. For the selected case, NAND gate 231 provides the logic pulse of signal *RX as a logic high pulse to inverter 232 which in turn provides signal *EQ as a logic low pulse. While signal *EQ is a logic low, transistor 224 is conductive, equalizing bit lines 203 and 204 by coupling them together. When signal *EQ is a logic high, transistor 224 is not conducting so that bit lines 203 and 204 are not coupled together. Signal *EQ is only a logic low in response to a row address transition in the case of that sub-array being selected. A column address transition will not cause signal *EQ to switch to a logic low so that transistor 224 does not equalize bit lines 203–204 in response to a column change. When the sub-array is deselected, NAND gate 231 is forced to provide a logic high output which causes inverter 232 to provide signal *EQ at a logic low. The bit lines in the deselected sub-arrays are thus all continuously equalized.

Circuit 214 provides signal *CX in response to a transition of the column address in the same way as circuit 213 provides signal *RX in response to a transition of the row address. A typical column address transition will cause signal *CX to pulse low for about 5 ns, while address skew will cause it to pulse low for a longer duration. Signal CD is functionally the same as signal *CX but circuit 214 provides it with a different output driver. Column decoder 202 is enabled as long as signal CD is a logic high. Upon a column address transition, signals *CX and CD pulse low causing column decoder 202 to be disabled so that no coupling transistors such as 208 and 209 will be enabled, thus isolating all of the bit lines from the data lines such as data lines 216 and 217. If the column address selects bit line pair 203–204, coupling transistors 208 and 209 switch from a conductive to a non-conductive state in response to signal CD switching to a logic low, isolating bit line pair 203–204 from data line pair 216–217. In the case in which there is only a column address transition, signal *EQ provided by inverter 232 is a logic high so that transistor 237 is conducting, and the output of NAND gate 231 is a logic low so that transistor 238 is conducting. Transistors 237 and 238 act as a conventional CMOS transmission gate. Prior to signal *CX switching to a logic low it is of course a logic high so that the input of inverter 233 receives a logic high via the transmission gate formed by transistors 237 and 238. Inverter 233 thus provides signal PRE at a logic low prior to the column address transition. Correspondingly, inverter 234 provides signal *PRE at a logic high prior to the column address transition. When signal *CX does pulse low, this logic low is coupled to inverter 233 via transistors 237 and 238 causing signal PRE to pulse high and signal *PRE to pulse low. Signal PRE at a logic high causes bit line precharging transistors 222 and 223 and data line precharging transistors 226 and 227 to become conductive. Data line equalizing transistor 228 is made conductive by signal *PRE switching to a logic low. Data lines 216 and 217 are equalized and precharged at about one N channel threshold voltage below VDD. For a deselected sub-array, NAND gate 231 is forced to provide a logic high output which causes transistor 236 to pull the input of inverter 233 to a logic low so that signal PRE and signal *PRE cause bit lines 203 and 204 and data lines 216–217 to be precharged. Because the deselected sub-arrays have no active word lines, the bit lines do not separate in the deselected sub-arrays. The bit lines and data lines being precharged and equalized is merely a sustaining action so that there is virtually no current drain due to the precharging transistors being conductive. By preventing any of the bit lines in the deselected sub-arrays from being discharged, the deselected sub-arrays do not experience the adverse power drain effects of precharging. Sustaining the precharge voltage while preventing any word lines from being enabled thus has the effect of decoupling the deselected sub-arrays from precharging and its disadvantageous effects.

The bit lines for a column address transition in a selected array, however, are only precharged and not equalized. Although it may appear that bit lines 203 and 204 will be equalized by virtue of being precharged to the same voltage, such is not the case. Prior to the column address transition a word line on the bit line pair was enabled and thus a memory cell on the bit line pair was actively coupled to the bit line pair so that one bit line is pulled to a lower voltage than the other. Assume that the row address has selected word line 219 so that row decoder 201 has enabled word line 219 and thereby enabling memory cell 206. Enabled memory cell 206 causes bit lines 203 and 204 to separate in voltage by pulling down one or the other bit line depending on which logic state memory cell 206 is in. Assume that bit line 203 is the relatively high side, and bit line 204 is the relatively low side and still assume that column decoder 202 had coupled bit line pair 203–204 to data line pair 216–217 prior to a column only address transition. Upon the column only address transition, simultaneously bit line pair 203 and 204 are decoupled from data line pair 216–217, bit line pair 203 and 204 are precharged, and data line pair 216–217 are equilibrated. The precharging of the bit lines raises the voltage on both bit lines 203 and 204. The logic high of bit line 203 deteriorates with time. Memory cell 206, by virtue of the nature of SRAM cells can vary effectively sustain a logic low on a bit line but is not nearly so effective in sustaining a logic high. A SRAM cell can sink current much more effectively than it can source current. Being coupled to the bit line causes the logic high side of the selected memory cell to degrade. Precharging the high side of the bit line keeps it from the adverse effects of degrading. Precharging the logic low side is not harmful because the enabled memory cell can, by sinking some current, keep the bit line sufficiently low to avoid risking reversing the data in the memory cell. Several accesses of bit line pair 203–204 without a row address change would result in a continuous drop in voltage on logic high bit line 203 if it were not precharged. This is called "walk-down" and can result in the loss of data if the logic high bit line drops close enough to the logic low bit line. Cells in a SRAM are not all perfectly balanced so that bringing the logic high bit line close to the logic low bit line can reverse the data in the enabled cell when the voltage level on the bit lines becomes relatively low. Included in the cross-coupled nature of a SRAM cell is the characteristic that the logic high drives the current sinking capability of the logic low. When the logic high is reduced, the current sinking capability of the logic low is reduced, making the memory cell susceptible to data loss. Bit failures and address pattern sensitivities have been experienced in rapid column-only address transitions in the prior art.

In the case in which there is a row address transition, signal *RX switches to a logic low causing NAND gate 231 to provide a logic high output and inverter 232 to provide a logic low output. This causes the transmission gate of transistors 237 and 238 to be non-conductive and transistor 236 to be conductive. The input to inverter 233 thus switches to a logic low, causing signal PRE to switch to a logic high and signal *PRE to switch to a logic low. This causes transistors 222, 223, 224, 226, 227, and 228 to all be conducting so that bit line pair 203–204 and data line pair 216–217 are both equilibrated in response to a row address transition without regard to whether or not there is a column address transition.

Figure 6:
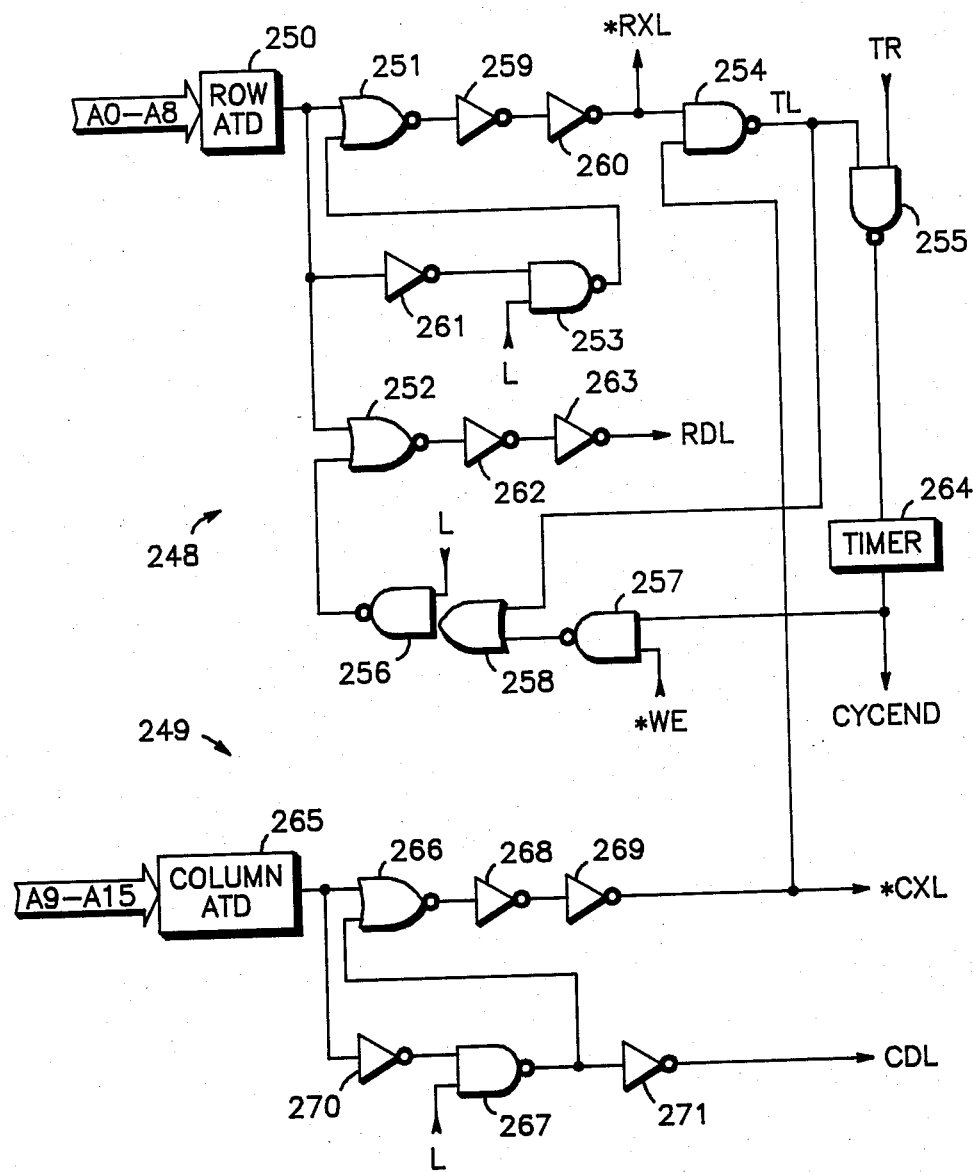
FIG. 6 is a combination block and logic diagram of a portion of the precharge and decoder control circuit of FIG. 5.

Shown in FIG. 6 is a combination block and logic diagram of a circuit 248 used in memory 10 useful in performing the function of circuit 213, and of a circuit 249 useful in performing the function of circuit 214 of FIG. 5. Circuit 248 is comprised of a row address transition detector 250, NOR gates 251 and 252, NAND gates 253, 254, 255, 256, and 257, OR gate 258, inverters 259, 260, 261, 262, and 263, and a timer 264. Circuit 249 is comprised of a column address transition detector 265, a NOR gate 266, a NAND gate 267, and inverters 268, 269, 270, and 271. Column ATD 265 receives column address signals A9–A15 and has an output which provides a positive pulse in response to a change in one or more of column address signals A9–A15. Inverter 270 has an input connected to the output of column ATD, and an output. NAND gate 267 has a first input connected to the output of inverter 270, a second input for receiving a left sub-array signal L, and an output. Inverter 271 has an input connected to the output of NAND gate 267, and an output for providing a column disable signal CDL for the left sub-arrays. NOR gate 266 has a first input for connected to the output of column ATD 265, a second input connected to the output of NAND gate 267, and an output. Inverter 268 has an input connected to the output of NOR gate 266, and an output. Inverter 269 has an input connected to the output of inverter 268, and an output for providing column transition signal *CXL for the left sub-arrays. Row ATD 250 receives row address signals A0–A8 and provides a positive pulse in response to a change in one or more of row address signals A0–A8 on its output. Inverter 261 has an input connected to the output of row ATD 250, and and output. NAND gate 253 has a first input connected to the output of inverter 261, a second input for receiving left sub-array signal L, and an output. NOR gate 251 has a first input connected to the output of row ATD 250, a second input connected to the output of NAND gate 253, and an output. Inverter 259 has an input connected to the output of NOR gate 251, and an output. Inverter 260 has an input connected to the output of inverter 259, and an output for providing a row transition signal *RXL for the left sub-arrays. NAND gate 254 has a first input connected to the output on inverter 260, a second input connected to the output of inverter 269, and an output for providing a timer signal TL for the left sub-arrays. NAND gate 255 has a first input connected to the output of NAND gate 254, a second input for receiving a timer signal TR for the right sub-arrays, and an output. Timer 264 has an input connected to the output of NAND gate 255, and an output for providing a cycle end signal CYCEND. NAND gate 257 has a first input connected to the output of timer 264, a second input for receiving a complementary write enable signal *WE, and an output. OR gate 258 has a first input connected to the output of NAND gate 257, a second input connected to the output of NAND gate 254, and an output. NAND gate 256 has a first input connected to the output of OR gate 258, a second input for receiving signal L, and an output. NOR gate 252 has a first input connected to the output of NAND gate 256, a second input connected to the output of row ATD 250, and an output. Inverter 262 has an input connected to the output of NOR gate 252, and an output. Inverter 263 has an input connected to the output of inverter 262, and an output for providing a row decoder disable signal RDL for the left sub-arrays.

Signal L, at a logic high, is indicative that one of the left sub-arrays 11–14 is selected. Signal L is a function of address signal A5. A corresponding signal R (not shown) is also generated indicative of one of the right sub-arrays 15–18 being selected. Signal *WE at a logic high is indicative that memory 10 is in a read mode.

Assuming that signal L is a logic high, circuit 249 provides signals *CXL and CDL as logic low pulses in response to Column ATD 265 providing a logic high pulse in response to a column address transition. Signals *CXL and CDL both are a logic high except when there is a column address transition. When signal L is a logic low, NAND gate 267 is forced to provide a logic high output which in turn forces NOR gate 266 to provide to provide a logic low output. Consequently, when the left sub-arrays 11–14 are deselected signals *CXL and CDL are forced to a logic low even when there is not a column address transition. Signal CDL is analogous to signal CD in FIG. 5. Signal CDL, however, enables and disables only the column decoders for left sub-arrays 11–14 not all of the sub-arrays as indicated in FIG. 5. For example, decoder 90 in FIG. 2 is disabled by signal CDL being a logic low, whereas decoder 91 does not receive signal CDL. Decoder 91 along with the other column decoders associated with the right sub-arrays are enabled by an analogous signal to signal CDL, except that it is responsive to column address transitions only when one of the right sub-arrays is selected. The actual implementation is to disable the column pre-decoders. Column pre-decoders 97–100 of sub-array 13 are disabled when signal CD is a logic low. This is achieved by forcing all of signals DEC0–DEC15 to a logic low which prevents any bit lines from being coupled to local data lines such as data line pair 124 and 125 in FIG. 3. The circuit (not shown) which generates the column disable signal for the right sub-arrays uses the output of column ATD 265 and is connected the same way as gates and inverters 266–271, except that the NAND gate analogous to NAND gate 267 receives the right sub-array signal R. As stated previously, there is a circuit 212 in FIG. 5 for each sub-array. Each circuit 212, which corresponds to left sub-arrays 11–14, receives signal *CXL as the signal analogous to signal *CX in FIG. 5. A right sub-array signal analogous to signal *CXL is for each circuit 212 which corresponds to sub-arrays 15–18.

Circuit 248 in FIG. 6 is shown as generating signals *RXL, RDL, and TL for left sub-arrays 11–14. All of circuit 248 except row ATD 250, NAND gates 255 and 257, and timer 264 are repeated for generating analogous signals for right sub-arrays 15–18. For generating the signals for the right sub-arrays, analogous gates to NAND gates 253 and 256 receive the right sub-array signal instead of signal L. When signal L is a logic high, signal *RXL provides a logic low pulse in response to row ATD providing a logic high pulse in response to a row address transition. When the left sub-arrays 11–14 are deselected, NAN gate 253 is forced to provide a logic high output which forces NOR gate 251 to provide a logic low output. Consequently, when left sub-arrays 11–14 are deselected, signal *RXL is forced to a logic low without regard to a row address transition.

When left sub-arrays 11–14 are deselected, signal TL is forced to a logic high so that NAND gate 255 and timer 264 are responsive to timer signal TR for right sub-arrays 15–18. When left sub-arrays 11–14 are deselected, NAND gate 256 is forced to provide a logic high to NOR gate 252, forcing NOR gate 252 to provide a logic low output, which in turn causes signal RDL to be a logic low without regard to row address transitions. Signal RDL, analogous to signal RD in FIG. 5, causes all of the word lines in left sub-arrays 11–14 to be deactivated. Row decoder 201 in FIG. 5 is representative of the entire row decoder circuitry which, in memory 10, includes the circuitry in block 34 which performs a partial row decode to generate the sub-array select signals, as well as global row decoders 32 and 33, and word line drivers 21–28. For memory 10, the disabling of the row decoder as described for circuit 200 in FIG. 5 is achieved by disabling the block select signals. Signal RDL at a logic low disables all of the block select signals associated with sub-arrays 11–14. The corresponding row decoder disable signal for right sub-arrays 15–18 at a logic low disables the block select signals associated with right sub-arrays 15–18.

When left sub-arrays 11–14 are selected, signal TR is a logic high so that NAND gate 255 is responsive to signal TL. Signal TL is normally a logic low but pulses to a logic high in response to a column or row address transition. When signal TL pulses to a logic high, NAND gate 255 responds by pulsing to a logic low which resets timer 264. As long as NAND gate 255 is a logic low, timer 264 will be in a reset state and will provide a logic low output to NAND gate 257. When the output of NAND gate 255 switches to a logic high, timer 264 will begin timing while maintaining a logic low output. When timer 264 has timed out, its output will switch to a logic high. Assuming memory 10 is in the read mode, NAND gate 256 will be controlled by the output of timer 264. During reset of timer 264 and while timer 264 is timing, NAND gate 257 provides a logic high output, causing OR gate 258 to provide a logic high output, which in turn causes NAND gate 256 to provide a logic low output. NOR gate 252 is thus responsive to the output of row ATD 250. When there is no row address transition, NOR gate 252 has both inputs at a logic low so that signal RDL is a logic high and the selected word line is enabled. When a row address transition causes row ATD to output a logic high pulse, NOR gate 252 causes signal RDL to pulse to a logic low, disabling all word lines for the duration of the pulse. The generation of *RXL from row ATD has the same number of stages, 3, that signal RDL has. Consequently, the occurrence of these two signals as logic low pulses is simultaneous. Because all of the word lines are ensured of being disabled during the occurrence of signal *RXL by signal RDL, all of the word lines are ensured of being disabled during equalization of the bit lines. In the write mode, NAND 257 gate is also forced to provide a logic high output so that signal RDL will not disable the word lines except during the logic low pulse of signal *RXL.

For the case in which timer 264 has timed out, NAND gate 257 provides a logic low output so long as memory 10 is in the read mode. OR gate 258 is then responsive to signal TL. Signal TL is a logic low except when it pulses to a logic high in response to a row or column address transition. When TL is a logic low, NAND gate 256 is forced to provide a logic high output in response to timer 264 timing out, which causes signal RDL to be a logic low, disabling all of the word lines. Consequently, after timer 264 has timed out, the word lines are disabled. For the case in which there is a row address transition after timer 264 has timed out, signal *RXL pulses to a logic low causing the bit lines to be equilibrated, signal TL to pulse to switch to a logic high, and timer 264 to be reset. For the case in which there is a column address transition after timer 264 has timed out, signal *CXL pulses to a logic low causing the bit lines to be precharged and signal TL to switch to a logic high. Signal TL is used to not only reset timer 264 but also to speed-up the enabling of the row decoder in the case in which timer 264 has timed out. The selected word line is thus enabled without the delay through the resetting of timer 264. Signal TL causes signal RDL to switch to a logic high about 5 ns after signal *CXL pulses to a logic low. This is timed so that signal RDL will enable the selected word line just as equilibration is terminating. If for some reason there is relatively severe row address skew so that the pulse generated by row ATD is of relatively long duration, NOR gate 252 prevents RDL from enabling the selected word line until signal *RXL is no longer actively equilibrating bit lines. By the time signal TL has switched back to a logic low, timer 264 has been reset and NAND gate 257 is providing a logic high output to ensure that the output of NAND gate 256 does not change state when signal TL switches back to a logic low.

Figure 7:
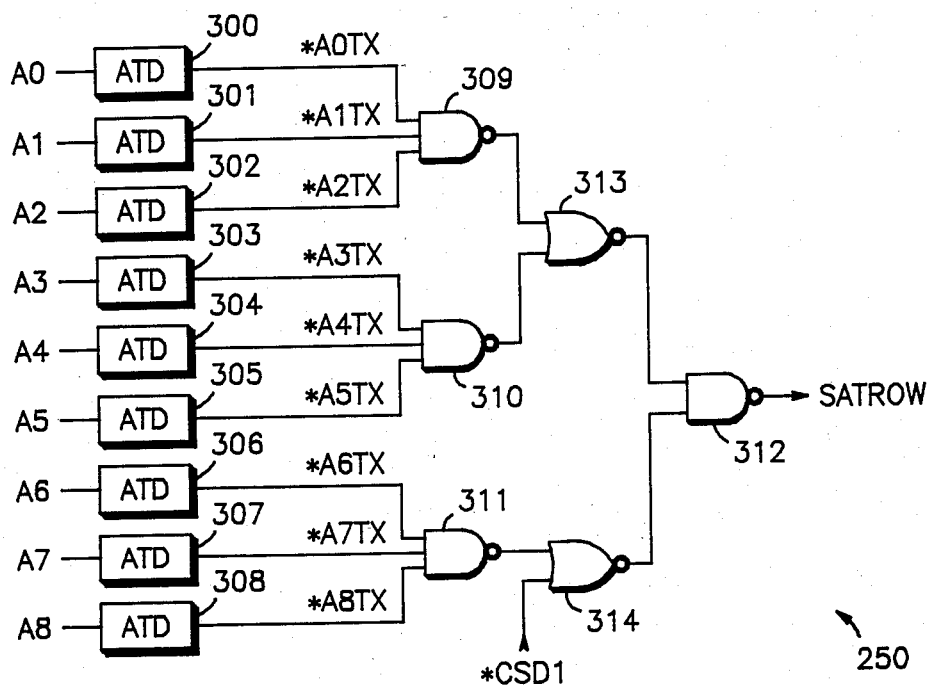
FIG. 7 is a combination block and logic diagram of a row summation address transition signal generator according to a preferred embodiment of the invention.

Shown in FIG. 7 is row address transition detector 250 shown in more detail. Row address transition detector 250 is comprised generally of address transition detectors (ATDs) 300, 301, 302, 303, 304, 305, 306, 307, and 308; NAND gates 309, 310, 311, and 312; and NOR gates 313 and 314. Each of address transition detectors 300-308 have an input for receiving one of row address signals A0-A8, respectively, and and output for providing an output pulse, pulses *A0TX, *A1TX, *A2TX, *A3TX, *A4TX, *A5TX, *A6TX, *A7TX, and *A8TX, respectively, on a transition of the received address. NAND gate 309 has a first input coupled to the output of ATD 300 for receiving pulse *A0TX, a second input coupled to the output of ATD 301 for receiving pulse *A1TX, a third input coupled to the output of ATD 302 for receiving pulse *A2TX, and an output. NAND gate 310 has a first input coupled to the output of ATD 303 for receiving pulse *A3TX, a second input coupled to the output of ATD 304 for receiving pulse *A4TX, a third input coupled to the output of ATD 305 for receiving pulse *A5TX, and an output. NAND gate 311 has a first input coupled to the output of ATD 306 for receiving pulse *A6TX, a second input coupled to the output of ATD 307 for receiving pulse *A7TX, a third input coupled to the output of ATD 307 for receiving pulse *A7TX, and an output. NOR gate 313 has a first input connected to the output of NAND gate 309, a second input connected to the output of NAND gate 310, and an output. NOR gate 314 has a first input connected to the output of NAND gate 311, a second input for receiving a row delayed chip select signal *CSD1, and an output. NAND gate 312 has a first input connected to the output NOR gate 313, a second input connected to the output of NOR gate 314, and an output for providing a row summation address transition signal SATROW. SATROW is the output of row address transition detector 250 which is connected to NOR gate 251 of FIG. 6.

ATDs 300-308 provide a logic high output until a row address transition occurs. Consequently, NAND gates 309-311 receive only logic highs on their inputs until a row address transition occurs. Prior to a row address transition, NAND gates 309-311 all provide logic low outputs. NOR gate 313 in turn receives logic low inputs so provides a logic high output. The first input of NOR gate 314 is a logic low while the second input is the logic state of signal *CSD1. While memory 10 is selected, signal *CSD1 is a logic low. NOR gate 314 thus provides a logic high output. NAND gate 312 thus provides SAT ROW at a logic low in the absence of a row address transition. The output of NAND gate 312 is the output of row address transition detector 250 which is connected to NOR gate 252 of FIG. 6.

When one of the row address signals A0-A8 changes logic state, the corresponding ATD of ATDs 300-308 provides the corresponding pulse of pulses *A0TX-*A8TX at a logic low for about 5 ns. Assume for example that row address signal A3 changes logic state. For such a row address transition, ATD 302 responds by providing pulse *A3TX at a logic low for about 5 ns. NAND gate 310 is then forced to provide a logic high output for the duration of pulse *A3TX. With NAND gate 309 pulsing to a logic high for about 5 ns forces NOR gate 313 to also to switch logic states for the duration of the pulse received on its first input, NOR gate 313 thus provides a logic low output pulse for about 5 ns which causes NAND gate 312 to provide SATROW at a logic high for about 5 ns. A single row address signal which changes logic state causes SATROW to switch to a logic high for the duration of the pulse provided by the ATD which corresponds to the changed row address signal. That portion of a data cycle which begins the sensing of data begins with the fall of SATROW, i.e., SATROW switching from a logic high to a logic low. If two row address signals simultaneously change logic states, SATROW will be produced at the same time and for the same duration as for a single row address transition. For example, if both signal A3 and A6 simultaneously change logic states, then pulses *A3TX and *A6TX are simultaneously generated, causing NAND gates 309 and 311 to provide simultaneous logic high pulses. Simultaneous logic high pulses to NOR gates 313 and 314 causes simultaneous logic low pulses from NOR gates 313 and 314. NAND gate 312 responds to simultaneous logic low pulses in the same way as for a single logic low pulse, by providing a logic high pulse for the duration of the received logic low pulse. For any number of simultaneous row address transitions, the resulting SATROW is essentially the same as for a single row address transition.

For the case in which there is row address skew, the case in which row address changes are delayed in time by a relatively short amount, SATROW is extended by the amount of the skew. For example, assume that row address signal A6 changes state 3 ns after signal A3 changes state. ATD 306 provides pulse *A6TX 3 ns after ATD 303 provides *A3TX so that NAND gate 311 receives a logic low input for 3 ns after NAND gate 309 is receiving only logic high inputs. Consequently, NAND gate 311 provides a logic high output for 3 ns after NAND gate 309 has terminated providing a logic high output. This results in NOR gate 314 providing a logic low output for 3 ns after NOR gate 313 has terminated providing a logic low output. NAND gate 312 thus is forced to provide SATROW at a logic high for 3 ns longer than that required by pulse *A3TX alone. If another row address signal is changed another 3 ns after signal A6 changed, then SATROW would be extended for yet another 3 ns. This extension will continue as long as there are address changes. As long as the address changes are at least as close together as the pulse width provided by the ATD circuits, SATROW will be held high until after the last address transition. Only if the address skew is so severe that the address changes are more than 5 ns apart, will SATROW switch to a logic low before the next address transition brings it back to a logic high. When the address skew is that severe, it is considered a different address so that it is desirable to reset the operation anyway. There is no operational problem in performing such a reset.

SATROW is also held to a logic high when memory 10 is deselected. Signal *CSD1 is delayed in time from the chip select signal which selects memory 10. To indicate deselection, the chip select signal is a logic high. To indicate selection, the chip select signal is a logic low. During deselection, sigal *CSD1 forces the output of NOR gate to a logic low which then forces NAND gate 312 to a logic high. With SATROW at a logic high, the bit line pairs are equalized. Signal *CSD1 causes the bit line pairs to be equalized when memory 10 is deselected. Additionally, because signal *CSD1 is delayed with respect to the chip select signal, signal *CSD1 keeps the bit line pairs equalized for a delay time following chip selection. The delay time is selected to be sufficiently long to prevent SATROW from switching to a logic low and then switching back to a logic high in response to a row address transition. The delayed feature of signal *CSD1 prevents memory 10 from beginning an access which would have to be immediately aborted by an address transition anyway.

Figure 8:
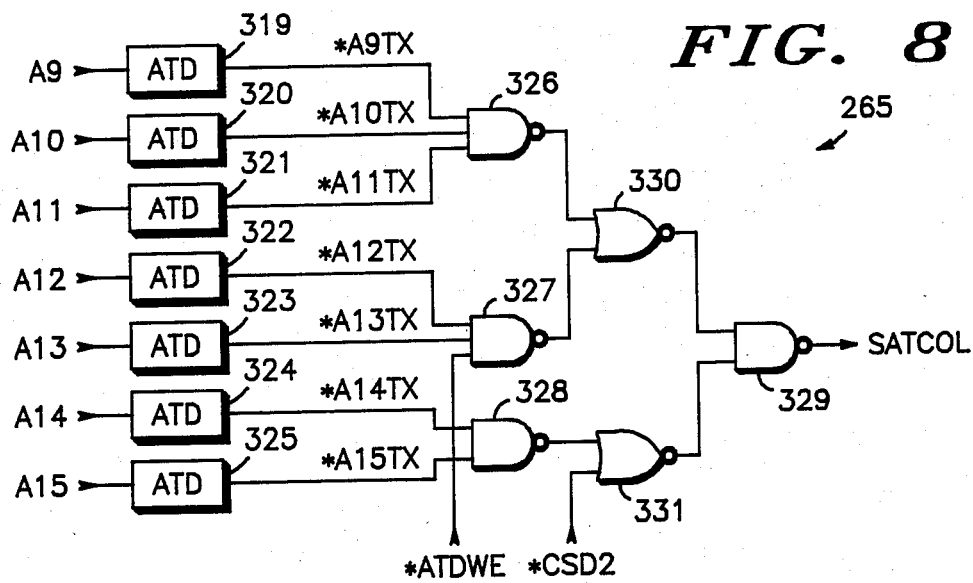
FIG. 8 is a combination block and logic diagram of a column summation address transition signal generator according to a preferred embodiment of the invention.

Shown in FIG. 8 is column address transition detector 265 shown in more detail. Column address transition detector 265 is comprised generally of address transition detectors (ATDs) 319, 320, 321, 322, 323, 324, and 325; NAND gates 326, 327, 328, and 329; and NOR gates 330 and 331. Each of address transition detectors 319-325 have an input for receiving one of column address signals A9-A15, respectively, and an output for providing an output pulse, pulses *A9TX, *A10TX, *A11TX, *A12TX, *A13TX, *A14TX, *A15TX, respectively, on a transition of the received address. NAND gate 326 has a first input coupled to the output of ATD 319 for receiving pulse *A9TX, a second input coupled to the output of ATD 320 for receiving pulse *A10TX, a third input coupled to the output of ATD 321 for receiving pulse *A11TX, and an output. NAND gate 327 has a first input coupled to the output of ATD 322 for receiving pulse *A12TX, a second input coupled to the output of ATD 323 for receiving pulse *A13TX, a third input for receiving signal address transition detection write enable signal *ATDWE, and an output. NAND gate 328 has a first input coupled to the output of ATD 324 for receiving pulse *A14TX, a second input coupled to the output of ATD 325 for receiving pulse *A15TX, and an output. NOR gate 330 has a first input connected to the output of NAND gate 326, a second input connected to the output of NAND gate 327, and an output. NOR gate 331 has a first input connected to the output of NAND gate 328, a second input for receiving a column delayed chip select signal *CSD2, and an output. NAND gate 329 has a first input connected to the output NOR gate 330, a second input connected to the output of NOR gate 331, and an output for providing a column row summation address transition signal SATCOL. SATCOL is the output of column address transition detector 265 which is connected to NOR gate 266 of FIG. 6.

Column address transition detector 265 provides SATCOL in response to a column address transition in the same way that row address transition detector 250 provides SATROW in response to a row address transition. In response to a single column address transition or a plurality of simultaneous column address transitions, SATCOL is a logic high for the duration of the pulse width provided by the ATD circuits 319-325, which is chosen to be about 5 ns. In the case of column address skew, SATCOL is extended in the same way as SATROW is for row address skew. SATCOL switching to a logic high initiates the bit lines being precharged as previously described for the output of column address transition detector 265. Additionally, signal *CSD2 is delayed from the chip select signal in substantially the same way as signal *CSD1 in FIG. 7. Signal *CSD2 at a logic high forces SATCOL to a logic high to precharge the bit lines during deselection of memory 10 and is delayed from switching back to a logic low with respect to the chip select signal. This causes SATCOL to remain a logic high for the delay period so that SATCOL does not have to switch to a logic low and then immediately back to a logic high in response to a column address transition. Signal *ATDWE at a logic low forces SATCOL to a logic high. Signal *ATDWE is normally a logic high but pulses to a logic low in response to a read to write or write to read transition. This is to use the normal high speed path to reset the timer 264 of FIG. 6 and begin the initiation of the cycle in the normal way as for an address transition.

Both row address transition detector 250 and column address transition detector 265 uses CMOS logic gates to perform the summation function for providing a pulse in response to any individual address transition. Detector 250 has a first group of CMOS logic gates 309-311 for receiving the address transition pulses. Each of these NAND gates 309-311 receives a subset of these transition pulses and provides an output pulse if one or more of the transition pulses occur. A second stage in the summation function is performed by a second group of CMOS logic gates 313 and 314. The third and final stage in the summation function is performed by CMOS logic gate 312. CMOS logic gates 312-314 provide SATROW in response to one or more of the first group of logic gates providing an output pulse. In the prior art, all of the transition pulses enabled transistors which were connected to a common node which resulted in tradeoffs between rapid pull-down and rapid pull-up and pulse shape. Poor output pulse shape can result in reliability problems for circuits which must use the poorly shaped signal. By dividing the summation function into more than one stage, each stage can control both pull-up and pull-down by taking full advantage of CMOS logic gates. The ratioless aspect, that the pull-up and pull-down transistors that make-up the logic gate are not on at the same time because the very same signal turns off the pull-up device which turns on the pull-down device and vice versa, of CMOS logic gates prevents the problems of having many pull-down devices on the same node while only having one pull-up device. The ratioless feature also results in an improvement in the power requirement. Also the gain of each stage is greater than unity whereas a single NOR gate of the prior art has less than unity gain due to the large number of inputs connected thereto.

In the present example of 9 row address signals A0–A8, a prior art circuit would have 9 transistors connected to a common node. This would result in the output being a logic low pulse instead of the logic high pulse of SATROW. This polarity difference is not particularly significant and is handled by some conventional inverting function to obtain the polarity needed. To simply convert the prior art of 9 input transistors connected to a common node with a separately clocked load device to a CMOS NOR gate is not particularly feasible because there would then be 9 P channel transistors in series between VDD and the output node and there would still be a large capacitance at the output node. Although breaking the 9 input NOR gate into several stages increases the number of gates in series between the ATDs and SATROW, the decrease in capacitance in each stage results in less propagation delay than through a 9 input NOR gate. Consequently, the row and column address transition detectors 250 and 265 provide improved control of the pull-up requirement for the summation address transition signals, improved signal shape, and improved speed. The technique of providing high gain SAT detection for row and column addresses, independently, prevents the need to combine the detection of the column and row transitions which would have the adverse effect of spreading the detection across the chip. The present technique provides a fully ratioless circuit which is not sensitive to the quantity of addresses, and thus has all of the advantages of such ratioless circuits, such as power supply insensitivity, and improved process corner insensitivity. It is also fully asynchronous so as to be insensitive to address skew or other address timing changes.

What is claimed is:

1. In a memory having a plurality of address transition detectors each for detecting a transition of a corresponding address signal and having an output for providing an output signal in response to such detection, a circuit for providing a transition pulse when one or more of the address transition detectors provides an output pulse, comprising:
a first plurality of logic gates having inputs coupled to the outputs of the address transition detectors, each logic gate having inputs coupled to a corresponding subset of the address transition detector outputs and having an output for providing a first intermediate transition signal in response to at least one of the address transition detectors in the corresponding subset providing an output signal;
a second plurality of logic gates having inputs coupled to the outputs of the first plurality of logic gates, each of the logic gates of the second plurality of logic gates having a plurality of inputs coupled to the outputs of a corresponding subset of the first plurality of logic gates and providing a second intermediate transition signal in response to at least one of the first plurality of logic gates providing a first intermediate transition signal; and
an output logic gate having inputs coupled to the outputs of the second plurality of logic gates and having an output for providing a summation address transition signal in response to one or more of the second intermediate address transition signals second plurality of logic gates providing a second intermediate address transition signal.

2. A memory, comprising:
a plurality of memory cells located at intersections of bit line pairs and word lines, each memory cell selected by an enabled word line and a selected bit line;
row decoder means coupled to the word lines for enabling a word line in response to a plurality of row address signals;
column decoder means coupled to the bit line pairs for selecting a bit line pair in response to a plurality of column address signals;
a plurality of row address transition detectors coupled to respective row address signals, each row address transition detector for providing a detection pulse in response to detecting a transition of the respective row address signal coupled thereto;
first logic means, coupled to the plurality of row address transition detectors, for providing a plurality of intermediate signals, each intermediate signal corresponding to a subset of the detection signals and occurring in response to an occurrence of at least one of the detection pulses in the subset to which the intermediate signal corresponds; and
second logic means, coupled to the first logic means, for providing a summation address transition signal in response to the occurrence of at least one of the intermediate signals.

3. The memory of claim 2 further comprising equalization means for equalizing the bit line pairs in response to the summation address transition signal.

4. The memory of claim 3 further comprising:
a plurality of column address transition detectors coupled to respective column address signals, each column address transition detector for providing a column detection pulse in response to detecting a transition of the respective column address signal coupled thereto;
third logic means, coupled to the plurality of column address transition detectors, for providing a plurality of column intermediate signals, each column intermediate signal corresponding to a subset of the column detection signals and occurring in response to an occurrence of one or more of the column detection pulses in the subset to which the column intermediate signal corresponds; and
fourth logic means having a plurality of inputs for receiving the column intermediate signals and for providing a column summation address transition signal in response to one or more of the column intermediate signals occurring.

5. The memory of claim 4 further comprising precharging means for precharging the bit lines in response to the column summation address transition signal.

6. The memory of claim 4 further comprising means for disabling the column decoder in response to the column summation address transition signal.

7. The memory of claim 2 further characterized as being enabled in response to an occurrence of a chip select signal, and wherein the second logic means is further characterized as providing the summation address transition signal for a predetermined delay time following the occurrence of the chip select signal.

8. The memory of claim 2 wherein the first and second logic means are comprised of CMOS logic gates.

9. The memory of claim 2 wherein the second logic means comprises:
   third logic means, coupled to the first logic means, for providing at least one of a plurality of output signals in response to the occurrence of at least one of the intermediate signals; and
   fourth logic means coupled to the third logic means for providing the summation address transition signal in response to the third logic means providing at least one of the output signals of the third logic means.

10. The memory of claim 9 wherein:
    the first logic means is comprised of CMOS NAND gates, wherein each NAND gate has an output for providing one of the intermediate signals, and a plurality of inputs for receiving the transition pulses which form the subset which corresponds to the intermediate signal provided thereby;
    third logic means is comprised of CMOS NOR gates having inputs coupled to the outputs of the CMOS NAND gates of the first logic means, and having outputs; and
    the fourth logic means is a CMOS NAND gate having inputs coupled to the outputs of the CMOS NOR gates of the third logic means, and an output for providing the summation address transition signal.

11. The memory of claim 2 further comprising means for disabling the row decoder in response to the summation address transition signal.

12. In a memory comprising:
    a plurality of memory cells located at intersections of bit line pairs and word lines, each memory cell selected by an enabled word line and a selected bit line;
    row decoder means coupled to the word lines for enabling a word line in response to a plurality of row address signals;
    column decoder means coupled to the bit line pairs for selecting a bit line pair in response to a plurality of column address signals; and
    a plurality of row address transition detectors coupled to respective row address signals, each row address transition detector for providing a detection pulse in response to detecting a transition of the respective row address signal coupled thereto;
    a method for providing a summation address transition signal in response to a transition of at least one row address signal, comprising:
    dividing the transition pulses into subsets;
    providing a plurality of intermediate pulses, each intermediate pulse corresponding to one of the subsets and occurring in response to the occurrence of at least one of the transition pulses in the corresponding subset; and
    providing the summation address transition signal in response to the occurrence of at least one of the intermediate pulses.

* * * * *

UNITED STATES PATENT AND TRADEMARK OFFICE
CERTIFICATE OF CORRECTION

PATENT NO. : 4,636,991

DATED : January 13, 1987

INVENTOR(S) : Stephen T. Flannagan et al

It is certified that error appears in the above-identified patent and that said Letters Patent is hereby corrected as shown below:

Column 20, line 11, delete "second intermediate address transition signals".

Signed and Sealed this

Twenty-eighth Day of April, 1987

Attest:

DONALD J. QUIGG

Attesting Officer

Commissioner of Patents and Trademarks